US010151637B2

(12) United States Patent
Iyechika et al.

(10) Patent No.: US 10,151,637 B2
(45) Date of Patent: Dec. 11, 2018

(54) FILM FORMING APPARATUS AND THERMOMETRY METHOD

(71) Applicant: NuFlare Technology, Inc., Kanagawa (JP)

(72) Inventors: Yasushi Iyechika, Chiba (JP); Masato Akita, Kanagawa (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 15/071,909

(22) Filed: Mar. 16, 2016

(65) Prior Publication Data

US 2016/0282188 A1  Sep. 29, 2016

(30) Foreign Application Priority Data

Mar. 27, 2015  (JP) .................................. 2015-065729

(51) Int. Cl.
*G01J 5/10*  (2006.01)
*G01J 5/08*  (2006.01)
(Continued)

(52) U.S. Cl.
CPC ............ *G01J 5/10* (2013.01); *C23C 16/4584* (2013.01); *C23C 16/46* (2013.01); *C23C 16/52* (2013.01); *G01J 5/0896* (2013.01)

(58) Field of Classification Search
CPC .... G01J 5/00; G01J 5/10; G01J 5/0896; G01J 5/16; H01L 21/02; H01L 21/02337;
(Continued)

(56) References Cited

U.S. PATENT DOCUMENTS 4,890,245 A * 12/1989 Yomoto ................ G01J 5/0003
                                                              250/492.2
5,879,128 A *  3/1999 Tietz ................... H01L 21/68742
                                                              414/757
(Continued)

FOREIGN PATENT DOCUMENTS

CN          104395998 A       3/2015
JP          2001-284261       10/2001
(Continued)

OTHER PUBLICATIONS

Office Action dated Dec. 29, 2017 in Chinese Application No. 201610183643.3; English Translation.
(Continued)

*Primary Examiner* — Gail Kaplan Verbitsky
(74) *Attorney, Agent, or Firm* — Rankin, Hill & Clark LLP

(57) ABSTRACT

A film forming apparatus includes: a support, a rotator, a gas supplier, and a radiation thermometer configured to measure a temperature of a surface of a substrate, wherein the radiation thermometer includes: a light source of an irradiation light to be irradiated to the surface of the substrate; a first light receiver configured to receive a reflected light from a first measurement region at a predetermined distance from the rotation center on the surface of the substrate; and a second light receiver configured to receive a heat radiation light from a second measurement region extending in a rotation direction of the substrate at the predetermined distance from the rotation center on the surface of the substrate.

20 Claims, 7 Drawing Sheets

(51) Int. Cl.
*C23C 16/52* (2006.01)
*C23C 16/458* (2006.01)
*C23C 16/46* (2006.01)

(58) Field of Classification Search
CPC ......... H01L 21/02345; H01L 21/67115; H01L 21/67248; H01L 21/68764; H01L 21/681; G23C 16/455; G23C 16/32
USPC .......... 438/14, 584, 758; 374/120, 121, 130, 374/178, 141
See application file for complete search history.

(56) References Cited

U.S. PATENT DOCUMENTS

| | | | | |
|---|---|---|---|---|
| 6,079,874 | A * | 6/2000 | Hegedus | C23C 16/481 118/725 |
| 6,080,965 | A * | 6/2000 | Osawa | H01L 21/67115 118/725 |
| 6,130,415 | A * | 10/2000 | Knoot | H01L 21/67248 219/502 |
| 6,133,152 | A * | 10/2000 | Bierman | C23C 16/4401 118/730 |
| 6,164,816 | A * | 12/2000 | Aderhold | G01J 5/0003 356/43 |
| 6,200,634 | B1 * | 3/2001 | Johnsgard | C23C 16/481 118/666 |
| 6,479,801 | B1 * | 11/2002 | Shigeoka | G01J 5/0003 219/497 |
| 7,734,439 | B2 * | 6/2010 | Timans | G01J 5/0003 702/99 |
| 8,104,951 | B2 * | 1/2012 | Aderhold | G01J 5/0022 118/666 |
| 8,668,383 | B2 * | 3/2014 | Timans | G01K 11/125 250/338.1 |
| 9,180,550 | B2 * | 11/2015 | Kusuda | H01L 21/324 |
| 9,395,309 | B2 * | 7/2016 | Pavani | G01N 21/9501 |
| 9,677,944 | B2 * | 6/2017 | Gurary | G01J 5/0007 |
| 2005/0063448 | A1 * | 3/2005 | Kusuda | H01L 21/67115 374/1 |
| 2006/0100735 | A1 * | 5/2006 | Hauf | G01J 5/0003 700/121 |
| 2007/0291816 | A1 * | 12/2007 | Volf | G01J 5/0003 374/1 |
| 2008/0099435 | A1 * | 5/2008 | Grimbergen | G03F 1/80 216/60 |
| 2008/0248657 | A1 * | 10/2008 | Nenyei | H01L 21/67115 438/799 |
| 2010/0111512 | A1 * | 5/2010 | Kumagai | G01J 5/62 392/416 |
| 2012/0133934 | A1 * | 5/2012 | Barlett | H01L 21/67248 356/326 |
| 2013/0343425 | A1 * | 12/2013 | Tas | G01J 5/0859 374/121 |
| 2014/0224425 | A1 * | 8/2014 | Mikami | H01L 22/12 156/345.13 |
| 2014/0284316 | A1 * | 9/2014 | Ji | G01J 5/0007 219/385 |
| 2014/0349068 | A1 * | 11/2014 | Inglis | C23C 16/01 428/141 |
| 2016/0041037 | A1 * | 2/2016 | Gurary | G01J 5/02 374/121 |

FOREIGN PATENT DOCUMENTS

| | | |
|---|---|---|
| JP | 2002-122480 | 4/2002 |
| JP | 2016-080590 | 5/2016 |
| KR | 10-2015-0023062 | 3/2015 |

OTHER PUBLICATIONS

Korean Office Action (KROA) dated May 25, 2018 issued in the corresponding Korean application No. 10-2016-0036773 and its English translation.

Japanese Office Action (JPOA) dated Jun. 29, 2018 issued in the corresponding Japanesen application No. 2015-065729 and its English translation.

* cited by examiner

FILM FORMING APPARATUS AND THERMOMETRY METHOD

CROSS REFERENCE TO RELATED APPLICATIONS

This application is based upon and claims the benefit of priority from the prior Japanese Patent Application No. 2015-65729, filed on Mar. 27, 2015, the entire contents of which are incorporated herein by reference.

FIELD

Embodiments according to the present invention relate to a film forming apparatus and a thermometry method.

BACKGROUND

A radiation thermometer is for measuring heat radiation light intensity (heat radiation intensity) radiated from a measuring target object, so as to obtain the temperature of the measuring target object. This radiation thermometer has a characteristic of being able to measure the temperature of the measuring target by a relatively short time without contacting the measuring target object, and thus has a high industrial value. When the temperature of a measuring target object is measured particularly under the circumstances that conditions of temperature, pressure, atmosphere, and the like are largely different from the external environment, the aforementioned characteristic is exhibited effectively. Moreover, when the measuring target object moves, the characteristic of the radiation thermometer of being a non-contact type is important.

Examples of industrial application using the radiation thermometer include production of semiconductors, production of compound semiconductors containing a nitride system, and the like. In order to produce high-quality semiconductors with high purity, in most cases, the interior of a manufacturing apparatus is isolated from the outside and a substrate retained in the interior of the manufacturing apparatus is heated to a high temperature. In particular, metal organic chemical vapor deposition (MOCVD) for performing film formation on a substrate by subjecting to a chemically reactive material gas, or molecular beam epitaxy (MBE) for forming a film on a substrate by evaporating constituent elements of a semiconductor in a high vacuum is well known.

For these semiconductor manufacturing apparatuses (one example of a film forming apparatus), very precise temperature measurement is required so as to favorably keep uniformity and repeatability of semiconductors produced. As a specific example, the temperature of a measuring target object (film formation target object) is in the range of 500° C. to 1200° C., and measurement precision is ±2° C. or less. In practice, in production of a light-emitting element with a multiple quantum well constituted of InGaN (indium gallium nitride) and GaN (gallium nitride) being a light-emitting layer, in the process of producing this light-emitting layer, the substrate is retained at a certain temperature determined from other manufacturing conditions within the range of about 700° C. to 800° C. This certain temperature largely affects the emission wavelength of the light-emitting element, and thus precise temperature measurement as described above is necessary for realizing high emission wavelength uniformity and repeatability.

On the other hand, in order to accurately measure the temperature of a measuring target object by using the radiation thermometer, a value of emissivity of the measuring target object is necessary. As the temperature of an object increases, heat radiation light intensity from the object increases, and thus it is possible to measure the temperature of the object by measuring the heat radiation light intensity from the object. However, heat radiation light intensity from a general object is smaller than heat radiation light intensity from a blackbody at the same temperature. The emissivity is obtained by dividing heat radiation light intensity from an object at a certain temperature by the heat radiation light intensity from the blackbody at the same temperature. Therefore, by measuring the heat radiation light intensity from an object and dividing this heat radiation light intensity by the emissivity of this object, the heat radiation light intensity radiated by the blackbody at the same temperature as this object can be obtained, and the temperature of the object can be calculated from this heat radiation light intensity. The radiation thermometer using the principle described here can respond to changes of optical parts in various configurations from the radiation thermometer to the measuring target object by performing calibration at an appropriate temperature, without performing calibration using the blackbody in a wide temperature range.

The emissivity is measured with various materials, and is published in various documents. In general, many radiation thermometers have a function to store emissivity and use it to correct the heat radiation light intensity from an object, and when the emissivity of the material of a measuring target object is known by a document value or the like, this can be stored for use in the radiation thermometer. However, the emissivity depends not only on the material of the measuring target object but also on the surface condition and temperature. In this sense, the published emissivity is difficult to be used for precise thermometry.

On the other hand, under certain limited conditions, it is possible to measure emissivity. That is, in the wavelength range of light for measuring heat radiation light intensity, when the light does not pass through the measuring target object and the light irradiated to the surface of the measuring target object does not scatter, the emissivity ($\varepsilon$) is represented by an equation $\varepsilon=1-R$, where R is the reflectivity of light of the surface of the measuring target object. Therefore, in the wavelength range of light for measuring heat radiation light intensity, when the surface of the measuring target object has sufficient specularity and it is possible to measure the reflectivity of the measuring target object by using an external light source, and the measuring target object absorbs light, the emissivity can be obtained irrespective of the surface condition and temperature of the measuring target object. In order to measure the temperature of the measuring target object with high precision by using such a method, it is crucial to accurately obtain the heat radiation light intensity from the measuring target object and the reflectivity with a preset wavelength.

The radiation thermometer which measures the temperature while obtaining the emissivity of the measuring target object as described above is particularly important for substrate thermometry when a thin film is formed on the substrate. In the process of forming the thin film on the substrate, due to occurrence of interference of light by the thin film, the emissivity of the substrate including the thin film changes constantly as the film formation proceeds (as the film becomes thicker). By this change in emissivity, even when the temperature of the measuring target object is constant, the heat radiation light intensity from the measuring target object changes. Even in such case, when conditions as described above are satisfied, correction of emissivity can be made by measuring the reflectivity appropriately by using the external light source.

However, in the conventional radiation thermometer, heat radiation light intensity from a narrow region on a measuring target object is measured for precisely measuring the heat radiation light intensity in a film formation process. This is because when non-uniformity due to a measurement position exists in a film thickness distribution or the like of a thin film formed on a surface of the aforementioned measuring target object, there may be cases that the heat radiation light intensity or the reflectivity to be measured cannot be measured precisely due to the influence of this non-uniformity of the thin film. On the other hand, when the measurement region for measuring the heat radiation light intensity becomes narrow, the signal intensity of the heat radiation light becomes low and noise becomes large, thus causing a problem that a measurable lower limit temperature becomes high.

An object to be achieved by the embodiments of the present invention is to provide a film forming apparatus and a thermometry method capable of lowering the measurable lower limit temperature while suppressing decrease in thermometry precision.

SUMMARY

A film forming apparatus according to the present embodiment includes:

a support configured to support a substrate;

a rotator configured to rotate the substrate in an in-plane direction via the support with a center of the substrate being a rotation center;

a gas supplier configured to supply a process gas onto the substrate;

an exhauster configured to exhaust gasses including the process gas after reaction;

a heater configured to heat the substrate; and a radiation thermometer configured to measure a temperature of a surface of the substrate, wherein the radiation thermometer comprises:

a light source of an irradiation light to be irradiated to the surface of the substrate;

a first light receiver configured to receive a reflected light from a first measurement region at a predetermined distance from the rotation center on the surface of the substrate; and a second light receiver configured to receive a heat radiation light from a second measurement region extending in a rotation direction of the substrate at the predetermined distance from the rotation center on the surface of the substrate.

A thermometry method according to the present embodiment includes the steps of:

supplying process gas to a surface of a substrate while rotating and heating the substrate with a center of the substrate being a rotation center;

irradiating a light to the surface of the substrate and measuring a reflected light from a first measurement region at a predetermined distance from the rotation center on the surface of the substrate; and measuring a heat radiation light from a second measurement region extending in a rotation direction of the substrate at the predetermined distance from the rotation center on the surface of the substrate.

DETAILED DESCRIPTION

Embodiments will now be explained with reference to the accompanying drawings. The present invention is not limited to the embodiments.

First Embodiment

A first embodiment will be described with reference to FIG. 1 to FIG. 8.

Figure 1:
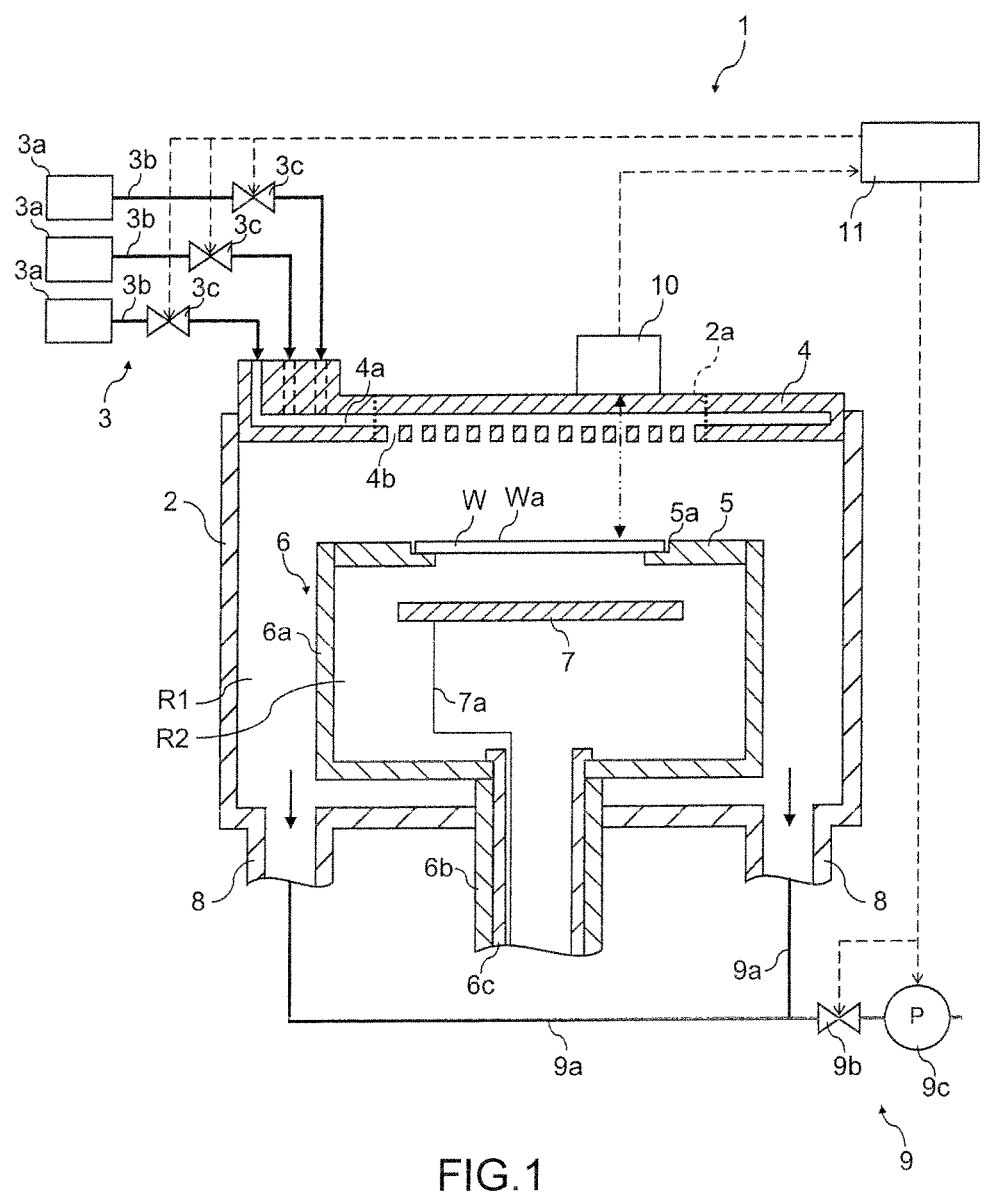
FIG. 1 is a diagram illustrating a schematic configuration of a film forming apparatus according to a first embodiment.

As illustrated in FIG. 1, a film forming apparatus 1 according to the first embodiment includes a chamber 2 forming a film on a substrate W (for example, a semiconductor substrate such as a wafer), a gas supplier 3 supplying gases (material gases) to the substrate W in the chamber 2, a raw material discharger 4 located above the chamber 2, a susceptor 5 supporting the substrate W in the chamber 2, a rotator 6 retaining the susceptor 5 and rotating the substrate W in an in-plane direction, a heater 7 heating the substrate W, gas exhausters 8 exhausting the gases in the chamber 2, an exhaust mechanism 9 exhausting gases via these gas exhausters 8, a radiation thermometer 10 measuring the temperature of the substrate W, and a controller 11 controlling respective parts.

The chamber 2 is formed in a box shape of a cylindrical shape or the like so that the substrate W as a film formation target can be accommodated therein, and accommodates the susceptor 5, the heater 7, part of the rotator 6, and so on in its inside.

The gas supplier 3 includes a plurality of gas storage parts 3a storing gases separately, gas pipes 3b connecting these gas storage parts 3a and the raw material discharger 4, and gas valves 3c each varying the flow rate of the gas flowing through one of the gas pipes 3b. When a plurality of gas pipes 3b are used, these gas valves 3c are provided individually on respective gas pipes 3b and connected electrically to the controller 11, and driving of them is controlled by the controller 11. Actual piping may have a complicated structure such as coupling a plurality of gas pipes, separating one gas pipe into several gas pipes, and further combining these coupling and separation, and the like.

The raw materials supplied from this gas supplier 3 are discharged into the chamber 2 via the raw material discharger 4. The material gases (process gases) discharged into the chamber 2 are supplied onto the substrate W, thereby forming a desired film on the substrate W. In addition, the types of the gases and the number of types thereof are not particularly limited.

The structure of the raw material discharger 4 has to be selected in consideration of uniformity, raw material efficiency, reproducibility, manufacturing costs, and so on of the formed film, but is not limited in particular. For example, a publicly known structure may be used as appropriate. This raw material discharger 4 has numerous gas supply channels 4a through which gases flow and gas discharge ports 4b leading to the gas supply channels 4a. These gas supply channels 4a and gas discharge ports 4b are formed as a structure capable of jetting gases in a shower form toward the substrate W in a state that the gases are separated without mixing plural types of gases (three types for example). In addition, the gases need not necessarily be supplied in a separated state, and may be supplied in a mixture.

The susceptor 5 is provided in an upper part of the rotator 6, and is formed in an annular shape having an opening 5a. This susceptor 5 is structured to accept and support the substrate W in a counterbore (annular recess) provided in an inner peripheral side of the opening 5a. In addition, although the susceptor 5 is in an annular shape having the opening in a center portion in the example illustrated in FIG. 1, the susceptor 5 may be in a substantially plate shape which does not have the opening 5a.

The rotator 6 has a cylindrical part 6a retaining the susceptor 5, and a hollow rotor 6b as a rotation axis of the cylindrical part 6a. The cylindrical part 6a is structured so that its upper portion is open, and the susceptor 5 is disposed in an upper portion of the cylindrical part 6a. When the substrate W is mounted on this susceptor 5, the opening 5a of the susceptor 5 is covered, and a hollow area is formed. In this rotator 6, as the rotor 6b is rotated by a rotation mechanism (not illustrated), the susceptor 5 rotates via the cylindrical part 6a. Accordingly, the substrate W on the susceptor 5 rotates in the in-plane direction of the substrate W as the susceptor 5 rotates.

The heater 7 is a heating unit provided in the cylindrical part 6a and heating the susceptor 5 and/or the substrate W. The heater 7 is not limited in particular as long as it satisfies requirements such as ability to heat an object to be heated to a desired temperature, uniformity, and durability. Specifically, it may be resistance heating, lamp heating, induction heating, or any other heating.

The exhaust mechanism 9 exhausts the gas including the material gases after reaction from the inside of the chamber 2 via the gas exhausters 8 and controls the inside of the chamber 2 to a predetermined pressure by operation of an exhaust valve 9b and a vacuum pump 9c.

The radiation thermometer 10 is provided on an upper part of the film forming apparatus 1, and irradiates the substrate W with a light from a light source and receives a reflected light of the irradiated light from the substrate W, so as to measure reflectivity of the substrate W. Further, the radiation thermometer 10 measures heat radiation light intensity from the substrate W by reception of a heat radiation light from the substrate W. Moreover, the radiation thermometer 10 uses the reflectivity of the substrate W and the heat radiation light intensity from the substrate W which are measured as described above, so as to obtain the temperature of the substrate W.

In addition, a light transmission window 2a is provided in the raw material discharger 4 so as not to block the above types of lights to be irradiated and the light as a measuring target of the radiation thermometer 10 from the substrate W. As the shape of the light transmission window 2a, one of various shapes, such as a slit shape, a rectangular shape, and a circular shape, can be used. This light transmission window 2a is used also by another optical measurement device, such as a curvature measuring device measuring the curvature of the substrate W, or by a detection device.

The controller 11 has, for example, a microcomputer having a processor centrally controlling respective parts and a storage device (both not illustrated) storing film forming process information related to a film forming process as well as various programs. In this controller 11, the microcomputer executes arithmetic processing to control the gas supplier 3, the rotation mechanism of the rotator 6, the exhaust mechanism 9, and so on based on the film forming process information and the various programs, so as to control heating of the substrate W by the heater 7, and the like. Incidentally, the controller 11 can also be made of, for example, an application specific integrated circuit (ASIC), a circuit device such as a programmable logic device, or the like.

Next, the above-described radiation thermometer 10 will be described in detail.

Figure 2:
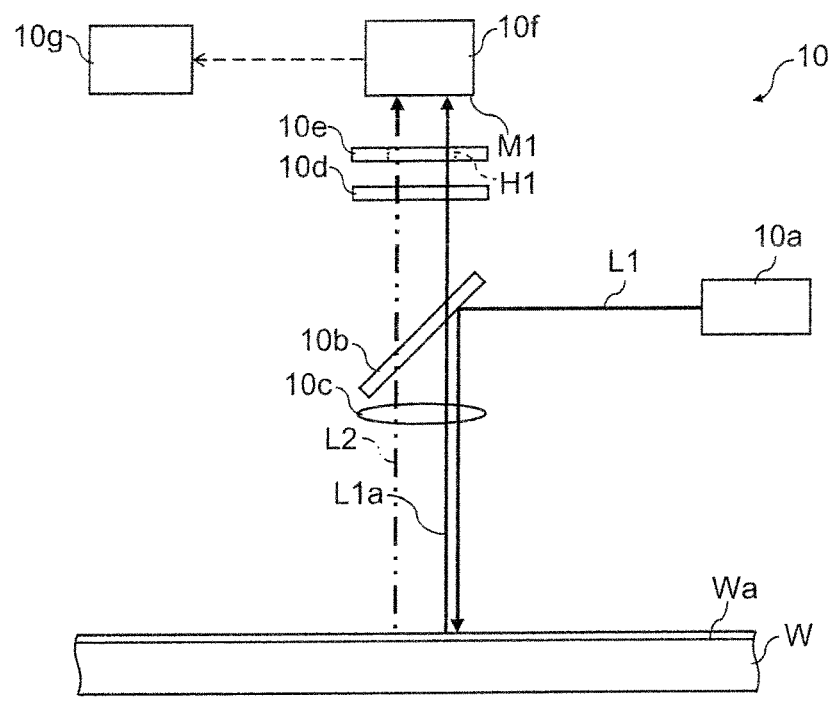
FIG. 2 is a diagram illustrating a schematic configuration of a radiation thermometer according to the first embodiment.

As illustrated in FIG. 2, the radiation thermometer 10 includes a light source 10a generating an irradiation light L1 to be irradiated to the substrate W, a half mirror 10b reflecting the irradiation light L1 generated by the light source 10a toward the substrate W, a lens 10c for adjusting a focus, an optical filter 10d passing a reflected light L1a and a heat radiation light L2 in a predetermined wavelength range, a diaphragm 10e passing lights from a part needed for measurement, a light receiver 10f receiving the reflected light L1a and the heat radiation light L2 which passed through the diaphragm 10e, and a calculator 10g calculating the temperature of the substrate W by using intensity of the reflected light L1a (reflected light intensity) and intensity of the heat radiation light L2 (heat radiation light intensity) which are received by the light receiver 10f.

Note that the irradiation light L1 is focused on the substrate W by operation of the lens 10c. Further, the reflected light L1a and the heat radiation light L2 from the substrate W are, by operation of the lens 10c, focused on a light receiving surface M1 of the light receiver 10f. The reflected light L1a is a reflected light from a first measurement region on a surface of the substrate W, and the heat radiation light L2 is a heat radiation light from a second measurement region defined by operation of the diaphragm 10e on the surface of the substrate W.

The diaphragm 10e is provided for selecting lights from a certain region of the substrate W. This is because of the reasons described below. Specifically, for the light L1 irradiated for measuring reflectivity of the substrate W, normally, a light emitting diode (LED) is attached directly to the light source 10a, or the light from an LED is guided to the light source 10a by using an optical fiber. In either case, the light source 10a is a point light source with a tiny light emitter. Therefore, the light L1 to be irradiated to the substrate W becomes a tiny spot on the substrate W by operation of the lens 10c. Moreover, the light L1a reflected on the substrate W similarly becomes a tiny spot on the light receiving surface M1 by operation of the lens 10c. On the other hand, the heat radiation light is emitted from every spot of the substrate W. Without the diaphragm 10e, the image of the entire substrate W is, by operation of the lens 10c in principal, imaged on substantially the same plane as the light receiving surface M1. This state is illustrated in FIG. 3.

Figure 3:
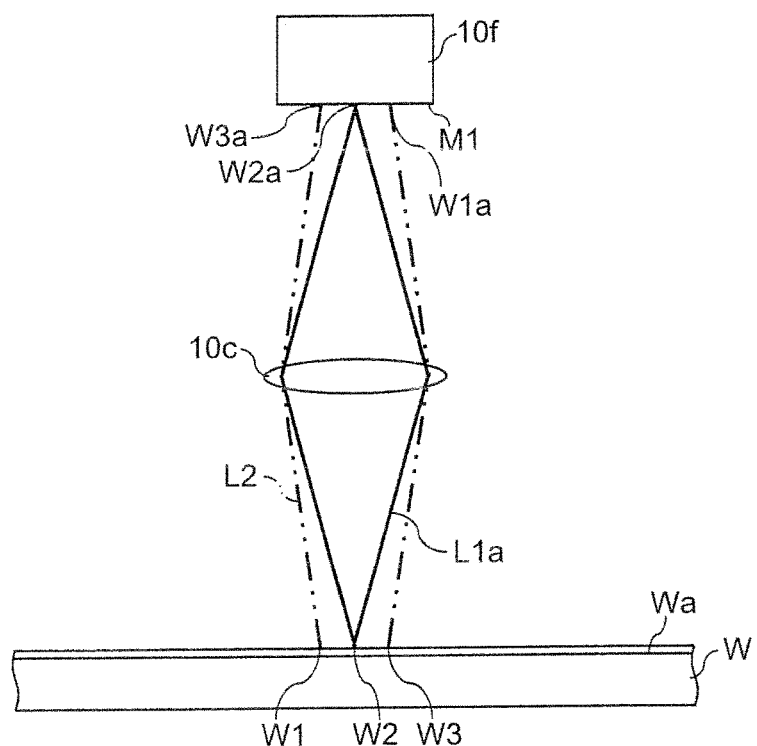
FIG. 3 is a diagram illustrating optical paths of a heat radiation light and a reflected light according to the first embodiment.

In FIG. 3, the substrate W, the lens 10c, the reflected light L1a, the heat radiation light L2, and the light receiver 10f are taken out and illustrated. The reflected light L1a forms a tiny region W2 on the substrate W as described above, and the reflected light L1a from this region W2 forms a tiny region W2a on the light receiving surface M1 by operation of the lens 10c. On the other hand, the heat radiation light L2 is emitted from every spot of the substrate W. Thus, when the diaphragm 10e is absent, the heat radiation light L2 emitted from, for example, positions of W1 and W3 on the substrate W is imaged at positions of W1a and W3a on the light receiving surface M1 by operation of the lens 10c. Specifically, as illustrated in FIG. 3, the heat radiation light emitted from the position Q1 shifted leftward from W2 on the substrate W is imaged at the position W1a shifted rightward from W2a on M1. Therefore, when the diaphragm 10e is absent, while the reflected light L1a observed on the light receiving surface M1 is from the tiny region W2 on the substrate W, the heat radiation light L2 is from a spread region including W1 to W2 to W3 on the substrate W. Accordingly, as illustrated in FIG. 2, providing the appropriate diaphragm 10e in the vicinity of the light receiving surface M1 allows to guide only the heat radiation light L2 from the vicinity of the measurement region W2 of the reflected light L1a on the substrate W to the light receiving surface M1, and to block the heat radiation light L2 from any other region.

Next, a problem in measuring of the heat radiation light L2 from a region wider than the measurement region of the reflected light L1a on the substrate W will be described.

Figure 4:
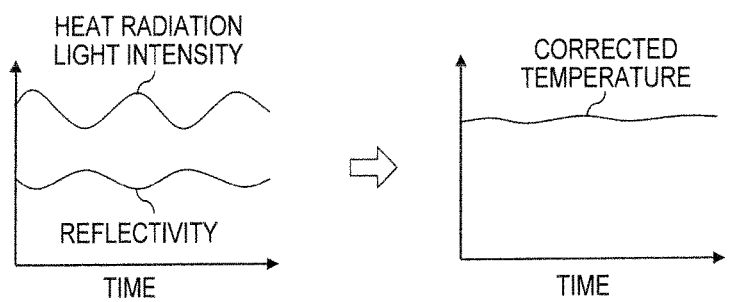
FIG. 4 is a diagram for explaining a first temperature calculation according to the first embodiment.

FIG. 4 presents an example schematically illustrating changes in reflectivity and heat radiation light intensity with respect to a film formation time of a thin film when the thin film is formed on the substrate W. As the formation time of the thin film becomes longer, the thickness of the thin film increases. As the thickness of the thin film increases, the reflectivity varies periodically due to an interference effect of light between the surface of the thin film and the interface between the substrate W and the thin film. On the other hand, emissivity of the substrate W including the thin film is obtained by subtracting the reflectivity from 1. As the reflectivity increases, the emissivity decreases and therefore the heat radiation light intensity also decreases. Correcting the heat radiation light intensity affected by this change in emissivity based on the emissivity obtained from the reflectivity enables to obtain the heat radiation light intensity in which the influence of thin film interference is corrected, and therefore to obtain a temperature in which the influence of interference is corrected.

Figure 5:
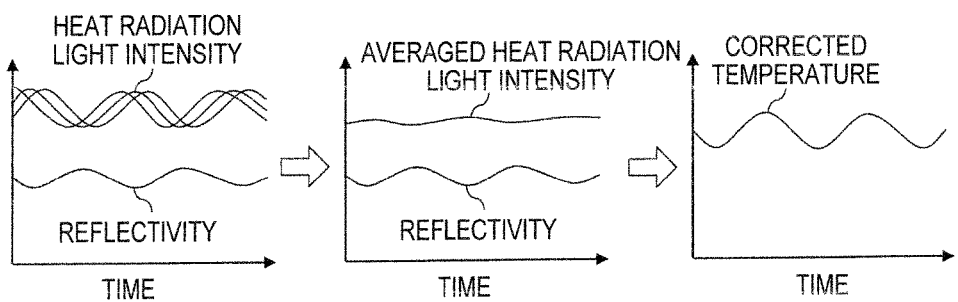
FIG. 5 is a diagram for explaining a second temperature calculation according to the first embodiment.

On the other hand, the thickness of the thin film formed on the substrate W has a distribution which changes by position on the substrate W. In a portion where the film thickness is different, the influence of thin film interference is different and the reflectivity is different. Specifically, in general, as the heat radiation light intensity from a different position on the substrate W, even if the temperature in the different position is the same, the effect of interference is different, and thus different heat radiation light intensity is exhibited. The states of the reflectivity and the heat radiation light intensity in this case are schematically illustrated in FIG. 5. As an example, in the region illustrated in FIG. 3, the reflectivity is measured only in a tiny region since the reflectivity is obtained from the reflected light L1a, and thus the influence of the film thickness distribution is small. On the other hand, the heat radiation light intensity is measured together with that from the region between W1 and W3 which is a portion with a different film thickness, and thus is an average of heat radiation light intensity from portions with different emissivity. This averaged heat radiation light intensity does not accurately reflect the reflectivity of the region where the reflectivity is measured, and thus there occurs a large error if this heat radiation light intensity is corrected by using the reflectivity of the tiny region.

From the above reasons, the diaphragm 10e is necessary which limits any other light than the light in the vicinity of the position where the reflected light L1a is measured in the heat radiation light L2 directed to the light receiving surface M1 from the substrate W.

Figure 6:
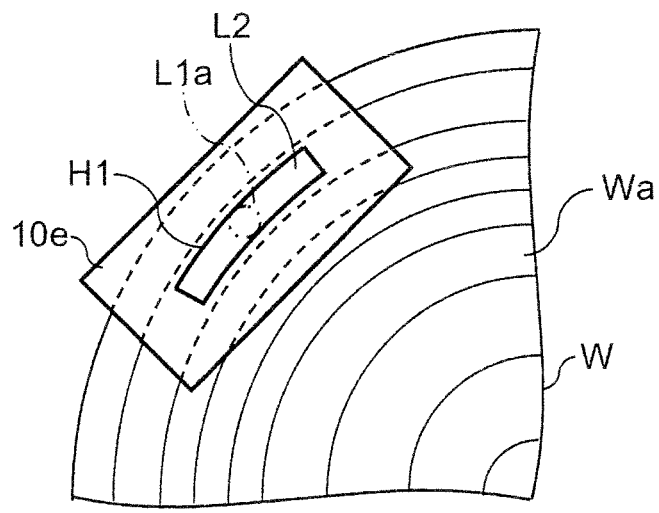
FIG. 6 is a diagram illustrating a diaphragm according to the first embodiment.

Incidentally, in what is called a single-wafer type apparatus which performs film formation processing while rotating the substrate W for one substrate W as illustrated in FIG. 1, the film thickness distribution in the rotation direction can be made substantially uniform. The state in this case is illustrated in FIG. 6. In a film formation process to form a film on a film formation target surface Wa of the substrate W, the film thickness on the film formation target surface Wa of the substrate W changes only in a radial direction of the substrate W. In addition, in FIG. 6, contour lines along a circumferential direction of the substrate W are drawn in order to visually illustrate film thickness changes (film thickness distribution) in the radial direction of the substrate W. The film thickness on the film formation target surface Wa of the substrate W gradually changes in the radial direction of the substrate W (direction orthogonal to a rotation axis of the substrate W), and hence the film thickness distribution in the radial direction is not uniform. However, the film thickness hardly changes in the circumferential direction of the substrate W (rotation direction of the substrate W), and hence the film thickness distribution in the circumferential direction becomes quite uniform.

Therefore, in the case of the single-wafer type film forming apparatus 1 as illustrated in FIG. 1, even when the measurement region of the heat radiation light intensity on the substrate W is a region including the measurement region of reflectivity and extending in the rotating direction, no error of the temperature corrected by the film thickness distribution occurs if the distances from the rotation center of both the measurement region of heat radiation light intensity and the measurement region of reflectivity and a length (width) of the regions in a direction orthogonal to the rotation direction of the both are equal. Here, the distance from the rotation center is, for example, the distance from the rotation center to the center of a measurement region, and hence a difference of some degree is allowed in both the distance and the length depending on required precision.

Therefore, the same effect is obtained even when heat radiation light intensity from the region on the substrate W extending in the circumferential direction of rotation is measured at a region having the same distance from the rotation center as the measurement region of reflectivity and not including at least a portion of the measurement region of reflectivity. This will be described in a second embodiment.

Hereinafter, methods for limiting a region where heat radiation light intensity is measured on the substrate W (first method, second method, and third method) as described above will be described.

Figure 7A:
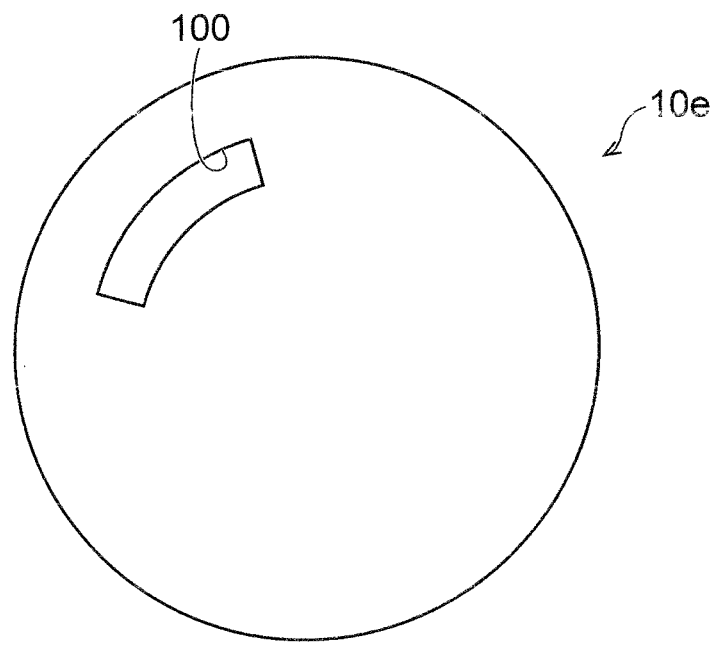
FIG. 7A is a diagram illustrating as a first method an example of a configuration of the diaphragm according to the first embodiment.

The first method relates to the shape of the above-described diaphragm 10e. As illustrated in FIG. 7A, the diaphragm 10e having an opening 100 extending in the rotation direction of the substrate W is provided between the light receiver 10f and the substrate W. By such a structure in which the shape of the diaphragm 10e has the opening 100 extending in the same direction as the rotation direction of the substrate W, the heat radiation light intensity from the region extending in the circumferential direction of the substrate W can be measured. As the extending shape of the opening 100, for example, a shape curving along the circumferential direction of the substrate W as illustrated in FIG. 7A can be used, or besides that, a shape such as a rectangle, a trapezoid, or an ellipse can be used.

Figure 7B:
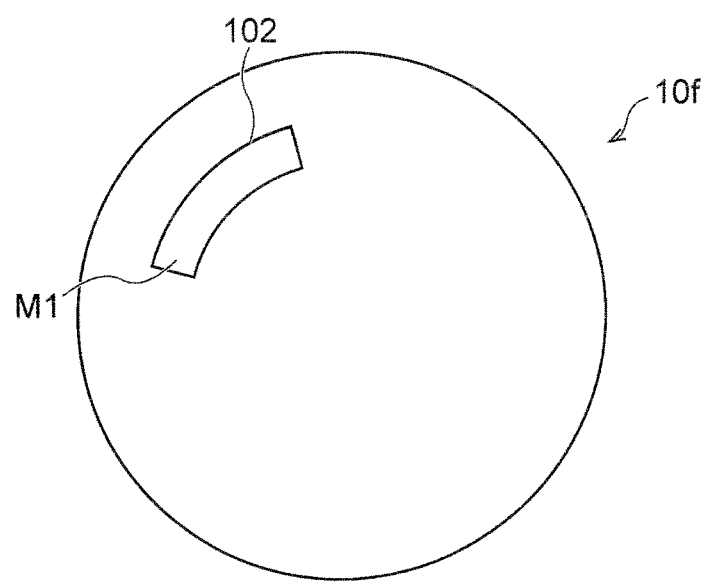
FIG. 7B is a diagram illustrating as a second method an example of a configuration of a light receiver according to the first embodiment.
Figure 7C:
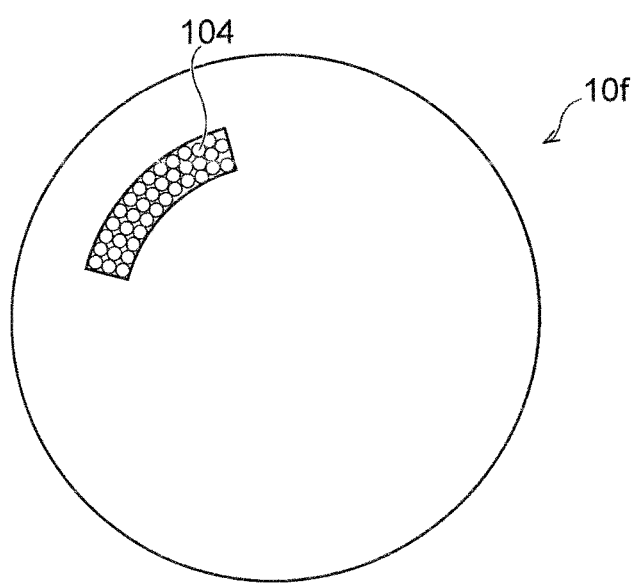
FIG. 7C is a diagram illustrating as another example of the second method an example of a configuration of the light receiver according to the first embodiment.

The second method relates to the shape of the light receiver 10f, namely, a detector. As illustrated in FIG. 7B, a detector 102 provided in the light receiver 10f has a shape extending in the rotation direction of the substrate W. When the light receiving surface M1 of the detector 102 has the shape extending in the rotation circumferential direction of the substrate W, the same effect as that by using the diaphragm 10e described in the first method can be achieved. This is also applicable to a detector using an optical fiber. In short, this relates to a structure in which, in FIG. 2, one end of an optical fiber is placed at the position of the light receiving surface M1 and the other end of the optical fiber is guided to the detector. In this case, as illustrated in FIG. 7C, one ends of a plurality of optical fibers 104 can be disposed in a shape extending in the rotation direction of the substrate W. Normally, the tip of an optical fiber 104 has a diameter of 1 mm or less, and introducing a light via this tip provides an effect similar to that when a diaphragm with a diameter of the optical fiber 104 is used. Therefore, arranging the tips of the plurality of optical fibers 104 in the rotation circumferential direction of the substrate W provides an effect similar to that when a diaphragm extending in the circumferential direction of the substrate W is used. After the plurality of optical fibers 104 are disposed as described above, they can also be twisted together to form one cable. Further, they can be made as one optical fiber by using an optical coupler.

Figure 7D:
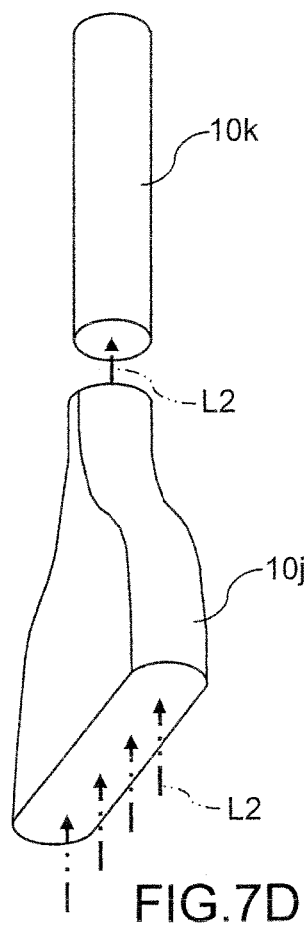
FIG. 7D is a diagram illustrating a configuration based on a third method according to the first embodiment.

The third method is to combine an optical fiber with a condenser to make a radiation thermometer. An overview of the third method is illustrated in FIG. 7D. In FIG. 7D, a condenser 10j condenses heat radiation light from the substrate W and guides it to an optical fiber 10k. The condenser 10j faces a direction to receive the heat radiation light L2 from the substrate W, and the surface receiving the heat radiation light L2 extends in a circumferential direction of rotation of the substrate W and is narrowed in a direction perpendicular to this direction, in order to limit the heat radiation light L2 from the diametrical direction of the substrate W so that correction of emissivity can be performed accurately. Since the portion receiving the heat radiation light L2 of the condenser 10j extends in the circumferential direction of rotation of the substrate W, the effects of the present invention can be obtained. In addition, although it is substantially rectangular in FIG. 7D, the opening of the condenser 10j may have an arc shape corresponding to the circumference of the film formation target surface Wa of the substrate W. In this case, the heat radiation light L2 which is more along the circumference can be condensed.

In the following description, the method using the diaphragm 10e described in the first method will be described, but the second or third method may be used as appropriate. Note that although the measurement region of the reflected light L1a (first measurement region) and the measurement region (second measurement region) of the heat radiation light L2 are set at the same position on the same circumference of the film formation target surface Wa, the measurement regions are not limited in particular as long as they are on the same circumference. In addition, the position of each measurement region is not limited to an outer peripheral side of the film formation target surface Wa, but for example, it may be on an inner peripheral side and is not limited in particular.

In the above-described radiation thermometer 10, when the temperature of the substrate W is measured, the irradiation light L1 is emitted by the light source 10a, and the irradiation light L1 emitted from the light source 10a is reflected by the half mirror 10b, passes through the lens 10c and the light transmission window 2a (see FIG. 1) of the film forming apparatus 1, and is irradiated on the substrate W, more specifically the film formation target surface Wa of the substrate W and the thin film formed on the film formation target surface Wa, thereby forming a tiny spot. Thereafter, the reflected light L1a reflected by the substrate W (the film formation target surface Wa and the thin film formed on the film formation target surface Wa) and the heat radiation light L2 emitted from the substrate W passes through the light transmission window 2a, the lens 10c, and the half mirror 10b.

The reflected light L1a and the heat radiation light L2 which have passed through the half mirror 10b pass the optical filter 10d and the diaphragm 10e, and this reflected light L1a in the predetermined wavelength range is received and detected as an electrical signal by the light receiver 10f. The heat radiation light L2 in the predetermined wavelength range becomes an extending shape extending in the circumferential direction of the substrate W by the diaphragm 10e, and is received and detected as an electrical signal by the light receiver 10f. That is, the heat radiation light L2 having the extending shape detected by the light receiver 10f is the light for measuring the heat radiation light intensity.

The signal detected as described above is sent to the calculator 10o, and the temperature of the substrate W is calculated by the calculator 10g. In this temperature calculation, emissivity of the substrate W is obtained based on the measured reflected light intensity (reflectivity), and the heat radiation light intensity (heat radiation intensity) from the substrate W is divided by this emissivity of the substrate W. Thus, the heat radiation light intensity radiated by the blackbody at the same temperature as the substrate W is obtained, and the temperature of the substrate W is calculated from this heat radiation light intensity. Thereafter, the temperature (temperature information) of the substrate W is sent to the controller 11 (see FIG. 1).

Note that in order to separate the signals of the reflected light intensity and the heat radiation light intensity from the substrate W in thermometry as described above, for example, a method to blink the light from the light source 10a in an appropriate cycle by the controller 11, and separate the signal corresponding to this cycle from the light intensity detected by the light receiver 10f, or the like can be used. At this time, the calculator 10g functions as a separator separating and using the signals of the reflected light intensity and the heat radiation light intensity from the film formation target surface Wa of the substrate W according to the above-described cycle.

Further, the heat radiation light intensity and the reflected light intensity from the substrate W can be considered as a wavelength integral of intensity in a selected predetermined wavelength range or an average value in the selected predetermined wavelength range. In the example of FIG. 2, it is possible to adjust the predetermined wavelength range with the optical filter 10d. This optical filter 10d functions as a wavelength selecting filter which selects a predetermined wavelength range, blocks light except the predetermined wavelength range and passes only the light in the predetermined wavelength range.

Here, when an opening H1 of the diaphragm 10e has an extending shape extending in the circumferential direction of the substrate W as illustrated in FIG. 6, the incident region of the heat radiation light L2 on the light receiving surface M1 has an extending shape extending in the circumferential direction of the substrate W, and the film thickness distribution in the circumferential direction on the substrate W is uniform. Thus, accurate heat radiation light intensity can be obtained (see FIG. 4). Thereafter, the temperature of the substrate W is obtained from this heat radiation light intensity and the reflected light intensity (reflectivity) by the above-described calculation, but as illustrated in FIG. 4, a fluctuation of the temperature corrected with the reflectivity is suppressed, and the temperature of the substrate W is measured accurately. Note that in FIG. 6 the length (width) in a direction orthogonal to the rotation direction of the substrate W in the measurement region (first measurement region) of the reflected light L1a and the length (width) in the direction orthogonal to the rotation direction of the substrate W (short-side direction) in the measurement region (second measurement region) of the heat radiation light L2 are equal, and the measurement region of the reflected light L1a exists within the measurement region of the heat radiation light L2.

Figure 8:
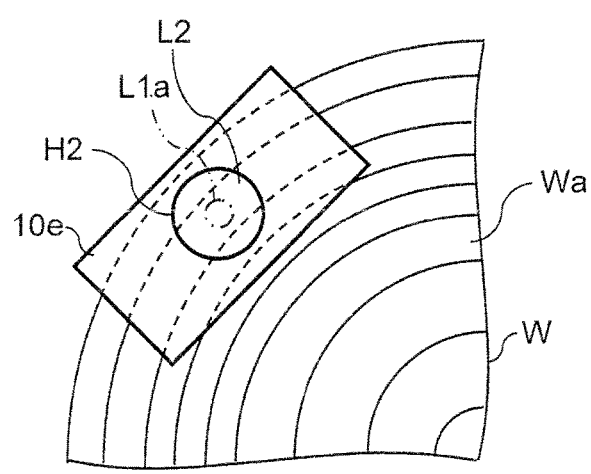
FIG. 8 is a diagram illustrating a comparative example of the diaphragm according to the first embodiment.

On the other hand, as a comparative example, as illustrated in FIG. 8, when the opening H2 of the diaphragm 10e has a circular shape larger than the diameter of the reflected light L1a (in FIG. 8, as an example, the diameter of the heat radiation light L2 on the light receiving surface M1 is about triple the diameter of the reflected light L1a on the light receiving surface M1), the incident region of the heat radiation light L2 on the light receiving surface M1 becomes a large circular shape, and the film thickness distribution in the radial direction on the substrate W is not uniform. Thus, due to this film thickness variation, as illustrated in FIG. 5, lights with different heat radiation light intensity are mixed together, and averaged heat radiation light intensity of them can be obtained. Thereafter, the temperature of the substrate W is obtained by the above-described calculation from this heat radiation light intensity and the reflected light intensity (reflectivity). However, as illustrated in FIG. 5, the temperature corrected with the reflectivity fluctuates largely, and the temperature of the substrate W is not measured accurately.

Therefore, it is important to shape the incident region of the heat radiation light L2 on the light receiving surface M1 in an extending shape extending in the circumferential direction of the substrate W. For example, when the incident region of the heat radiation light L2 on the light receiving surface M1 is shaped in the extending shape extending in the circumferential direction of the substrate W and the incident region size of the extending shape is 1 mm×7 mm (width× length), as compared to when the incident region size of the circular heat radiation light L2 on the light receiving surface M1 is ϕ1 mm (diameter is 1 mm), the measurement region for measuring heat radiation light intensity is about 10 times larger, and the S/N (Signal to Noise ratio: SN ratio) is also 10 times larger. Accordingly, the measurable lower limit temperature can be lowered by 100° C. or more.

Thus, in the single-wafer type film forming apparatus 1 which forms a film on the substrate W, the heat radiation light intensity from the measurement region (second measurement region) having the extending shape extending in the circumferential direction of the substrate W on the film formation target surface Wa of the substrate W is measured. Accordingly, it is possible to measure the heat radiation light intensity from a wider region than by conventional apparatuses. Thus, the signal strength increases and noise becomes small, and hence the measurable lower limit can be lowered. Moreover, the film thickness distribution in the circumferential direction on the film formation target surface Wa of the substrate W is uniform. Thus, when the heat radiation light intensity from a wider region extending in the circumferential direction is measured (when the measurement region is wider than conventional ones), it is hardly affected by interference from a different film thickness region in the radial direction of the substrate W (direction orthogonal to the rotation direction of the substrate W). Thus, it is possible to suppress decrease in thermometry precision due to enlargement of the measurement region.

As described above, according to the first embodiment, by providing the diaphragm 10e which narrows the heat radiation light L2 radiated from the film formation target surface Wa in the extending shape extending in the circumferential direction of the substrate W (rotation direction of the substrate W), the heat radiation light L2 having the extending shape extending in the circumferential direction of the substrate W is received by the light receiver 10f. Accordingly, it is possible to measure the heat radiation light intensity from a region which is wider than conventional ones and extends in the circumferential direction of the substrate W. Here, since the film thickness distribution in the circumferential direction on the film formation target surface Wa of the substrate W is uniform, when the heat radiation light intensity from a wider region extending in the circumferential direction is measured, it is hardly affected by interference from a different film thickness region in the radial direction of the substrate W. Therefore, it is possible to measure the heat radiation light intensity from a region wider than conventional ones on the film formation target surface Wa of the substrate W while being hardly affected by interference from a different film thickness region in the radial direction of the substrate W, so as to increase the signal strength and reduce noise, and thus the measurable lower limit temperature can be lowered while suppressing decrease in thermometry precision.

Note that the measuring wavelength range for measuring heat radiation light intensity can be determined appropriately according to the temperature to be measured of the measuring target. In manufacturing of a compound semiconductor by MOCVD or MBE, the substrate W is heated in a temperature range of about 500° C. or more and 1200° C. or less in most cases. In this case, as the wavelength for measuring the heat radiation light intensity, setting a wavelength of 400 nm or more and 3000 nm or less is preferred because measurement precision of temperature becomes high. More preferably, it is set between 600 nm or more and 2000 nm or less, furthermore preferably between 800 nm or more and 1500 nm or less. Further, when measurement at a higher temperature than the above-described temperature range is necessary, the above-described wavelength range may be set shorter, or conversely when measurement at a lower temperature is necessary, the above-described wavelength range may be set longer.

Second Embodiment

A second embodiment will be described with reference to FIG. 9. In the second embodiment, differences from the first embodiment (structure of the radiation thermometer 10) will be described, and other descriptions are omitted.

Figure 9:
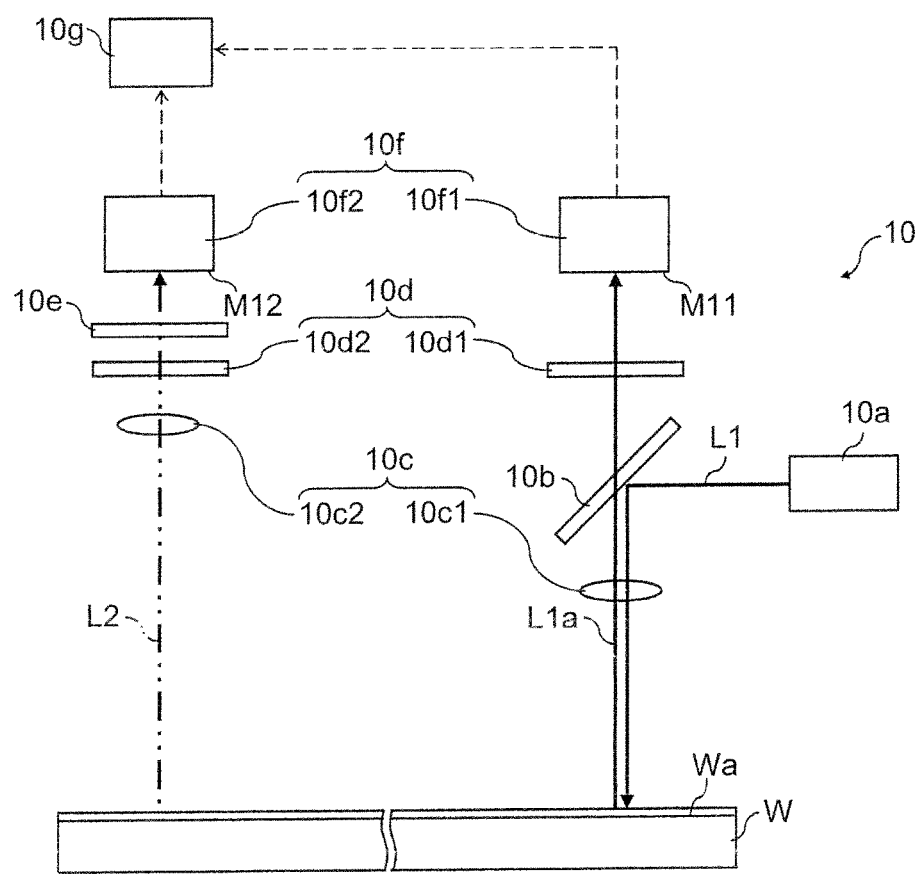
FIG. 9 is a diagram illustrating a schematic configuration of a radiation thermometer according to a second embodiment.

As illustrated in FIG. 9, the radiation thermometer 10 according to the second embodiment has a structure in which an optical system is provided for each of a reflected light L1a and a heat radiation light L2. A lens 10c is constituted of a first lens 10c1 and a second lens 10c2 (structures thereof are similar to the lens 10c according to the first embodiment), and a light receiver 10f is constituted of a first light receiver 10f1 and a second light receiver 10f2 (structures thereof are similar to the light receiver 10f according to the first embodiment) which are two separate light receiving parts. Moreover, an optical filter 10d is constituted of a first optical filter 10d1 and a second optical filter 10d2 (structures thereof are similar to the optical filter 10d according to the first embodiment). Note that in FIG. 9, the light receiving surface of the first light receiver 10f1 is denoted by M11, and the light receiving surface of the second light receiver 10f2 is denoted by M12.

The lens 10c1, the half mirror 10b, and the first optical filter 10d1 are disposed in an optical path from the film formation target surface Wa of the substrate W to the first light receiver 10f1. Further, the lens 10c2, the second optical filter 10d2, and the diaphragm 10e are disposed in an optical path from the film formation target surface Wa of the substrate W to the second light receiver 10f2. Note that the measurement region of the reflected light L1a and the measurement region of the heat radiation light L2 are present at different positions on the same circumference of the film formation target surface Wa, for example, positions opposing each other with the rotation center of the substrate W being a center.

In the first embodiment, the reflected light L1a and the heat radiation light L2 have overlapping optical paths, and hence the both pass through the same optical filter 10d. However, in the second embodiment, the reflected light L1a and the heat radiation light L2 have different optical paths, and pass through different optical filters 10d1, 10d2. When the spectrum of the light L1 from the light source 10a for measuring the reflected light and the spectrum of the heat radiation light L2 or a blackbody radiation spectrum at about the same temperature as the substrate W are largely different, there may be cases where it is possible to suppress errors due to differences in spectrum by setting characteristics such as a central wavelength, a width at half maximum, and a transmission spectrum of the first optical filter 10d1 and the second optical filter 10d2 to different values intentionally in advance. In such cases, characteristics of these optical filters 10d1 and 10d2 need not be the same.

In such a radiation thermometer 10, when the temperature of the substrate W is measured, the irradiation light L1 is emitted by the light source 10a, and the irradiation light L1 emitted by the light source 10a is reflected by the half mirror 10b, passes through the lens 10c1 and the light transmission window 2a of the film forming apparatus 1 (see FIG. 1), and is irradiated to the substrate W, more specifically, the film formation target surface Wa of the substrate W and a thin film formed on the film formation target surface Wa. Thereafter, reflected light L1a reflected by the substrate W (the film formation target surface Wa and the thin film formed on the film formation target surface Wa) passes through the light transmission window 2a, the lens 10c1, the half mirror 10b, and the optical filter 10d1. The reflected light L1a in a predetermined wavelength range is received and detected as an electrical signal by the light receiver 10f1.

Further, the heat radiation light L2 emitted from the substrate W is condensed on a lower surface of the diaphragm 10e by the lens 10c2 and passes through the optical filter 10d2 and the diaphragm 10e. The heat radiation light L2 in a predetermined wavelength range becomes an extending shape extending in a circumferential direction of the substrate W by the diaphragm 10e, and is received and detected as an electrical signal by the light receiver 10f2. Specifically, the heat radiation light L2 of the extending shape detected by the light receiver 10f2 is the light for measuring the heat radiation light intensity. The calculation processing by the calculator 10g thereafter is similar to that of the first embodiment.

Thus, similarly to the first embodiment, in the single-wafer type film forming apparatus 1 which forms a film on the substrate W, the heat radiation light intensity from the measurement region having the extending shape extending in the circumferential direction of the substrate W on the film formation target surface Wa of the substrate W is measured. Accordingly, it is possible to measure the heat radiation light intensity from a wider region than by conventional apparatuses. Thus, the signal strength increases and noise becomes small, and hence the measurable lower limit can be lowered. Moreover, the film thickness distribution in the circumferential direction on the film formation target surface Wa of the substrate W is uniform. Thus, when the heat radiation light intensity from a wider region extending in the circumferential direction is measured (when the measurement region is wider than conventional ones), it is hardly affected by interference from a different film thickness region in the radial direction of the substrate W. Thus, it is possible to suppress decrease in thermometry precision due to enlargement of the measurement region.

Moreover, by providing the optical system for each of the reflected light L1a and the heat radiation light L2, the degree of freedom of position of the measurement region of each of the reflected light L1a and the heat radiation light L2 can be improved. For example, by these measurement regions present at different positions on the same circumference of the film formation target surface Wa, for example, positions opposing each other with the rotation center of the substrate W being a center, it becomes possible to detect a warp, an inclination, a displacement, and/or the like of the substrate W. In this case, the reflected light intensity and heat radiation light intensity, that is, the measurement temperature changes due to a warp, an inclination, a displacement, and/or the like of the substrate W, and thus this change (for example, rapid temperature change, accidental temperature change, or the like) is detected so as to detect a warp, an inclination, a displacement, and/or the like of the substrate W. When there is a problem, the film formation processing is stopped or the user or the like is notified of occurrence of the problem.

As has been described, according to the second embodiment, the same effects as the above-described first embodiment can be obtained. Further, by providing the optical system for each of the reflected light L1a and the heat radiation light L2, the degree of freedom of position of the measurement region of each of the reflected light L1a and the heat radiation light L2 can be improved. For example, by the measurement regions present at different positions on the same circumference of the film formation target surface Wa, for example, positions opposing each other with the rotation center of the substrate W being a center, it becomes possible to detect a warp, an inclination, a displacement, and/or the like of the substrate W.

Other Embodiments

In the above-described embodiments, film formation by MOCVD, MBE, or the like is mentioned as a main application example. However, as long as there is a possibility that a temperature change of the substrate accompanying film formation occurs, it is not limited to the MOCVD or MBE and is applicable to a method such as sputtering or vapor deposition. Further, regarding the configuration of the above-described radiation thermometer 10, the configurations illustrated in FIG. 2 and FIG. 7 are illustrations, and various changes can be added to this component, a configuration method thereof, and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A film forming apparatus comprising:
a wafer support configured to support a single wafer;
a rotator configured to rotate the wafer in an in-plane direction via the wafer support with a center of the wafer being a rotation center;
a gas supplier configured to supply a process gas onto the wafer;
an exhauster configured to exhaust gasses including the process gas after reaction;
a heater configured to heat the wafer; and
a radiation thermometer configured to measure a temperature of a surface of the wafer,
wherein the radiation thermometer comprises:
a light source of an irradiation light to be irradiated to the surface of the wafer;
a first light receiver configured to receive a reflected light from a first measurement region at a predetermined distance from the rotation center on the surface of the wafer; and
a second light receiver configured to receive a heat radiation light from a second measurement region simultaneously, the heat radiation light having an extended region on a light receiving surface of the second light receiver, the extended region extended in a corresponding direction of a rotation direction of the wafer, the second measurement region having a shape extended from the first measurement region in the rotation direction of the wafer at the predetermined distance from the rotation center on the surface of the wafer.

2. The film forming apparatus according to claim 1, wherein a length in a direction orthogonal to the rotation direction of the wafer in the first measurement region and a length in the direction orthogonal to the rotation direction of the wafer in the second measurement region are substantially equal.

3. The film forming apparatus according to claim 1, wherein the first measurement region exists within the second measurement region.

4. The film forming apparatus according to claim 1, wherein the first measurement region and the second measurement region are not overlapped at least partially.

5. The film forming apparatus according to claim 4, wherein the first measurement region and the second measurement region are placed on a same circumference about the rotation center.

6. The film forming apparatus according to claim 1, wherein the second light receiver receives the heat radiation light from a film formation target surface of the wafer.

7. The film forming apparatus according to claim 1, wherein the first light receiver and the second light receiver are constituted of one and the same light receiver.

8. The film forming apparatus according to claim 1, wherein the first light receiver and the second light receiver are constituted of two separate light receivers.

9. The film forming apparatus according to claim 1, wherein the second light receiver further comprises a diaphragm having an opening extending in the rotation direction of the wafer between the second light receiver and the wafer.

10. The film forming apparatus according to claim 1, wherein a detector provided in the second light receiver has a shape extending in the rotation direction of the wafer.

11. The film forming apparatus according to claim 10, wherein one end of an optical fiber is placed at a position of the light receiving surface of the second light receiver.

12. The film forming apparatus according to claim 11, wherein the light receiving surface is formed by placing one ends of a plurality of optical fibers in a shape extending in the rotation direction of the wafer.

13. The film forming apparatus according to claim 1, wherein the radiation thermometer comprises a condenser configured to condense the heat radiation light from the second measurement region on the second light receiver.

14. A thermometry method comprising the steps of:
supplying process gas to a surface of a wafer while rotating and heating the wafer with a center of the wafer being a rotation center;
irradiating a light to the surface of the wafer and measuring a reflected light from a first measurement region at a predetermined distance from the rotation center on the surface of the wafer; and
measuring a heat radiation light from a second measurement region simultaneously, the heat radiation light having a spread region on a light receiving surface of a second light receiver, the spread region extended in a rotation direction of the wafer, the second measurement region having a shape extended from the first measurement region in the rotation direction of the wafer at the predetermined distance from the rotation center on the surface of the wafer.

15. The film forming apparatus according to claim 1, wherein the second light receiver comprises at least one of a diaphragm having an opening and a detector having a light receiving surface, the opening and the light receiving surface having an extending shape extending in the rotation direction of the wafer such that the second light receiver receives the heat radiation light from the second measurement region.

16. The film forming apparatus according to claim 1, wherein the first measurement region has a circular shape, the second measurement region has an extending shape extending in the rotation direction of the wafer, and a width of the extending shape of the second measurement region in a direction orthogonal to the rotation direction is substantially equal to a diameter of the circular shape of the first measurement region, and a length of the extending shape of the second measurement region in the rotation direction is longer than the diameter of the circular shape of the first measurement region.

17. A film forming apparatus comprising:
a wafer support configured to support a single wafer;

a rotator configured to rotate the wafer in an in-plane direction via the wafer support with a center of the wafer being a rotation center;

a gas supplier configured to supply a process gas onto the wafer;

an exhauster configured to exhaust gasses including the process gas after reaction;

a heater configured to heat the wafer; and a radiation thermometer configured to measure a temperature of a surface of the wafer, wherein the radiation thermometer comprises:

a light source of an irradiation light to be irradiated to the surface of the wafer;

a first light receiver configured to receive a reflected light from a first measurement region at a predetermined distance from the rotation center on the surface of the wafer; and a second light receiver comprising at least one of a diaphragm having an opening and a detector having a light receiving surface, the opening and the light receiving surface having an extending shape extending in a rotation direction of the wafer such that the second light receiver receives a heat radiation light from a second measurement region extending in the rotation direction of the wafer at the predetermined distance from the rotation center on the surface of the wafer.

18. The film forming apparatus according to claim 17, wherein a length in a direction orthogonal to the rotation direction of the wafer in the first measurement region and a length in the direction orthogonal to the rotation direction of the wafer in the second measurement region are substantially equal.

19. The film forming apparatus according to claim 17, wherein the first measurement region exists within the second measurement region.

20. The film forming apparatus according to claim 17, wherein the first measurement region and the second measurement region are not overlapped at least partially.

* * * * *